(12) United States Patent
Liang

(10) Patent No.: US 7,813,131 B2
(45) Date of Patent: Oct. 12, 2010

(54) MODULAR OUTDOOR LED POWER SUPPLY

(75) Inventor: Chien-Kuo Liang, Chung-Ho (TW)

(73) Assignee: Aeon Lighting Technology Inc., Chung-Ho, Taipei County (TW)

( * ) Notice: Subject to any disclaimer, the term of this patent is extended or adjusted under 35 U.S.C. 154(b) by 0 days.

(21) Appl. No.: 12/081,590

(22) Filed: Apr. 17, 2008

(65) Prior Publication Data

US 2010/0214744 A1    Aug. 26, 2010

(51) Int. Cl.
*H05K 7/20* (2006.01)
*H01L 23/34* (2006.01)

(52) U.S. Cl. .................. 361/704; 361/703; 361/715; 361/716; 361/719; 174/521; 174/526; 174/547; 307/157; 363/141

(58) Field of Classification Search ......... 361/676–678, 361/679.54, 703–704, 707, 709, 715–716, 361/719–721; 174/521, 526, 547–548; 362/218, 362/294, 362, 373, 375, 546–547; 307/23, 307/64, 65, 150, 157
See application file for complete search history.

(56) References Cited

U.S. PATENT DOCUMENTS

| | | | | |
|---|---|---|---|---|
| 4,791,531 A | * | 12/1988 | Jessup | ................... 361/736 |
| 5,742,478 A | * | 4/1998 | Wu | .......................... 361/704 |
| 6,046,908 A | * | 4/2000 | Feng | ......................... 361/707 |
| 6,411,514 B1 | * | 6/2002 | Hussaini | .................... 361/704 |
| 7,267,461 B2 | * | 9/2007 | Kan et al. | .................. 362/373 |
| 7,272,008 B2 | * | 9/2007 | Hussaini et al. | ............ 361/715 |
| 7,359,203 B2 | * | 4/2008 | Chen | ......................... 361/714 |
| 7,654,703 B2 | * | 2/2010 | Kan et al. | .................. 362/362 |
| 2010/0027266 A1 | * | 2/2010 | Tsai et al. | ................... 362/267 |

* cited by examiner

*Primary Examiner*—Robert J Hoffberg
(74) *Attorney, Agent, or Firm*—Jackson IPG PLLC; Demian K. Jackson

(57) ABSTRACT

The main objective of the present invention is a modular outdoor LED power supply disposed inside or outside of an outdoor LED light or an LED device so as to decrease the distance between the power supply and a LED light base for preventing an output power drop from an output of the power supply to the LED light base. One or more than one power supply can be disposed in a groove of a main heat-dissipating outer cover of the power supply according to the actual requirements, so that the production and installation thereof become more convenient. The power supply is characterized by being water-resistant, moisture-proof, dust-proof, antirust and direct heat-dissipating, wherein the water-resistant effect is above the IP 65 standard, and thus the reliability and the lifetime of the power supply are increased.

10 Claims, 6 Drawing Sheets

MODULAR OUTDOOR LED POWER SUPPLY

BACKGROUND OF THE INVENTION

1. Technical Field

The present invention relates to a modular outdoor LED power supply, and more particularly, to a power supply disposed on an outdoor LED light or a LED device, and characterized by being modular, water-resistant, dust-proofing, highly acid or alkaline air-proofing, antirust and direct heat-dissipating.

2. Description of Related Art

According to a typical embodiment, a conventional power supply of an outdoor LED street light or an LED device as disclosed in the Taiwan patent of application No. 096138178 and titled "CLOSED POWER SUPPLY", when in use, has the following shortcomings to be improved.

First, as shown in FIG. 7 to FIG. 9 in the patent, a plurality of power supplies are inserted in a modular base. Considering the environmental effects, the modular base must be inserted into an outer housing for water-resistance and moisture-proofing. Therefore, the power supply can not be disposed on the external surface of a pole of an LED street light or a LED device, and better heat-dissipating efficiency can not be achieved.

Second, the power supply is distant from the outdoor LED street light or the LED device, a voltage drop easily occurs and thus the output power of the power supply is lowered.

Third, each power supply has an independent heat-dissipating shield; in other words, each heat-dissipating shield constructs a single power supply, and two or more than two power supplies can not be selected arbitrarily according to a specific requirement.

Fourth, each power supply needs a heat-dissipating shield, resulting in higher costs and lower practicability.

SUMMARY OF THE INVENTION

One objective of the present invention is to provide a modular outdoor LED power supply. The power supply is disposed inside or outside an LED light pole or a LED device, and the distance between the power supply and a LED light base is decreased to prevent a power drop from the output of the power supply to the LED light base.

Another objective of the present invention is to provide a power supply for an LED street light. One or more than one power supply are disposed in an inner groove of a main heat-dissipating outer cover of the power supply according to the actual requirement.

Still another objective of the present invention is to provide a modular outdoor LED power supply. The power supply is characterized by being water-resistant and moisture-proof, highly acid or alkaline air-proof, dust-proof, antirust and direct heat-dissipating, wherein the water-resistant effect is above the IP 65 standard, so that the power supply can be disposed on a light pole of an outdoor LED light base or on an LED device.

DETAILED DESCRIPTION OF THE PREFERRED EMBODIMENT

Figure 1:
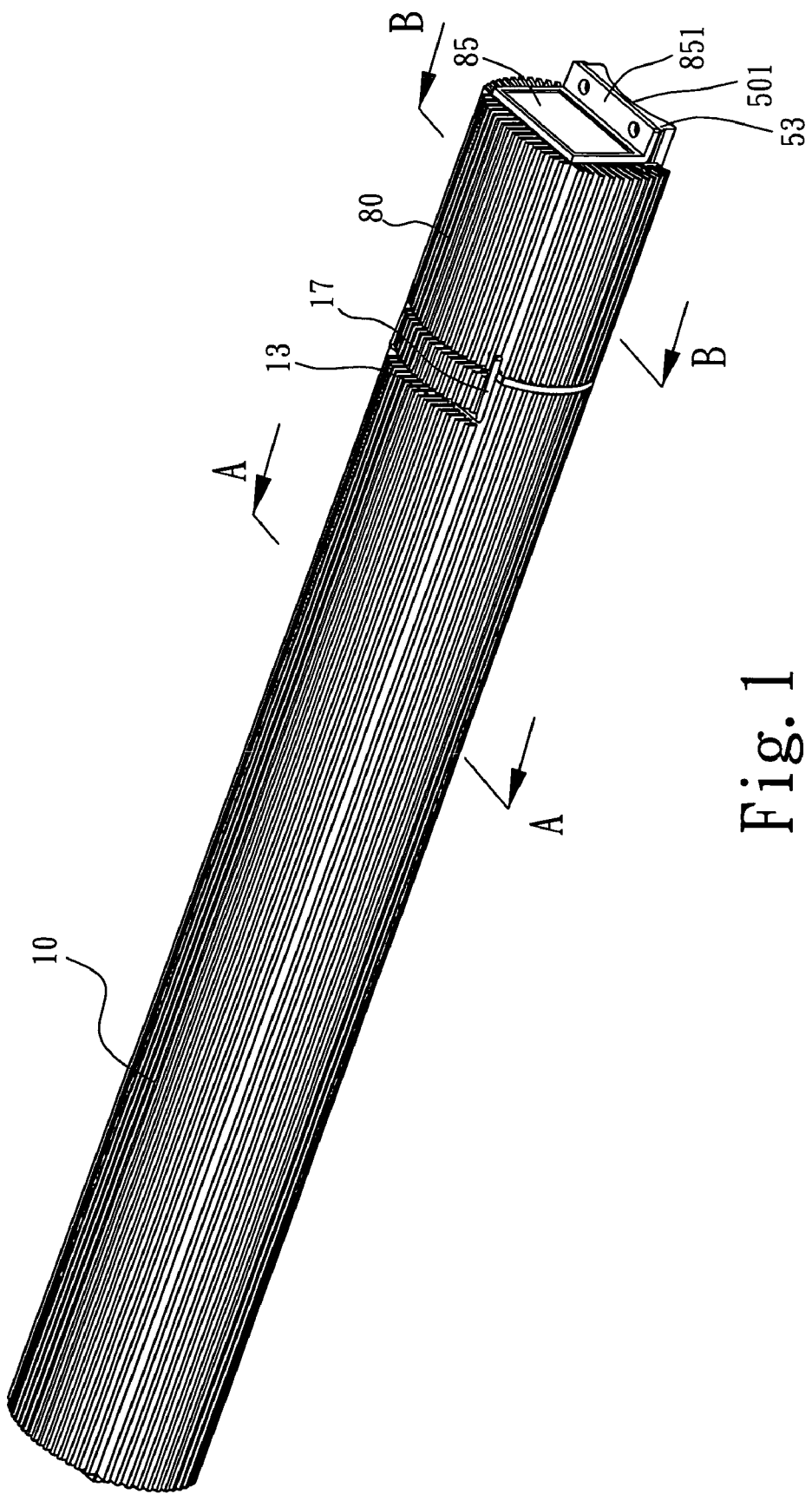
FIG. 1 is an assembly perspective view according to one preferred embodiment of the present invention.
Figure 2:
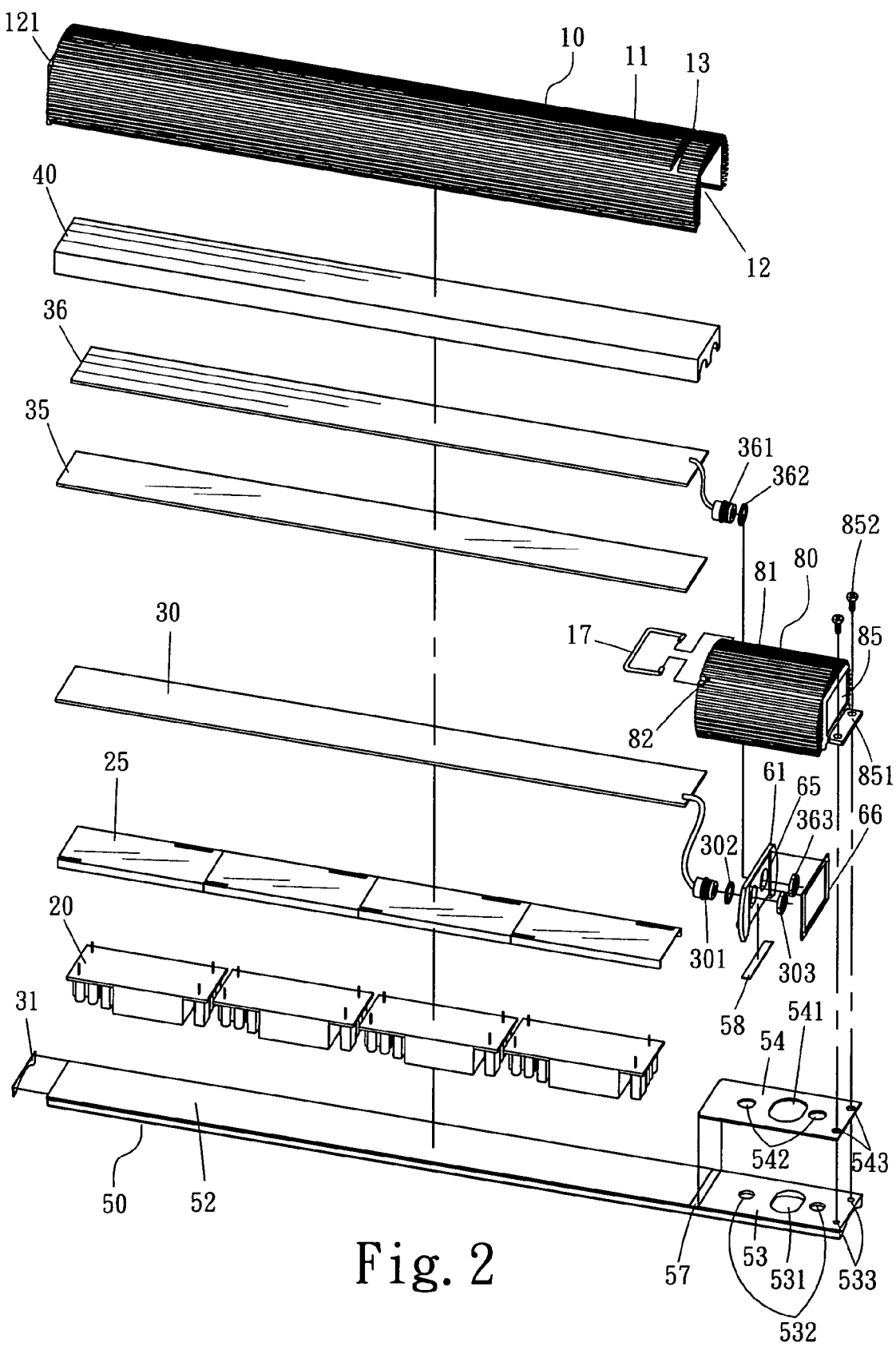
FIG. 2 is an exploded perspective view according to one preferred embodiment of the present invention.

Referring to FIG. 1 and FIG. 2, a modular outdoor LED power supply according to one preferred embodiment of the present invention includes the following components.

A main heat-dissipating outer cover 10 includes a groove 12 inside. A plurality of heat-dissipating fins 11 are disposed on a surface of the main heat-dissipating outer cover 10. A fixing plate 121 closes a left opening of the groove 12, wherein the groove 12 contains the following components:

a. one or more than one power supply 20, wherein an insulating plate 25 is connected to a bottom of each power supply 20, the power supplies 20 being electrically connected to a circuit board 30 as described below;

b. one or more than one printed circuit boards (PCBs) 30 and 36, wherein when two PCBs are used, an insulating plate 35 is disposed between the two PCBs, an AC power input connector 361 and a DC power output connector 301 being connected to one end of the PCBs 30 and 36, first water-resistant washers 362 and 302 being attached on an inner edge or an outer edge;

c. an insulating container 40 with a groove containing a PCB 30 or 36, the insulating plate 35, a lower insulating plate 25 and the power supply 20, the insulating container 40 being contained in an inner groove 12 of the main heat-dissipating outer cover 10; and d. a bottom plate 50 being disposed in the bottom of the main heat-dissipating outer cover 10 in a track-like manner and closing the groove 12 of the main heat-dissipating outer cover 10, a second water-resistant washer 31 being disposed between one end of the bottom plate 50 and the fixing plate 121 on the left of the main heat-dissipating outer cover 10. A gasket 66 is further included, as shown in FIG. 2.

Figure 3:
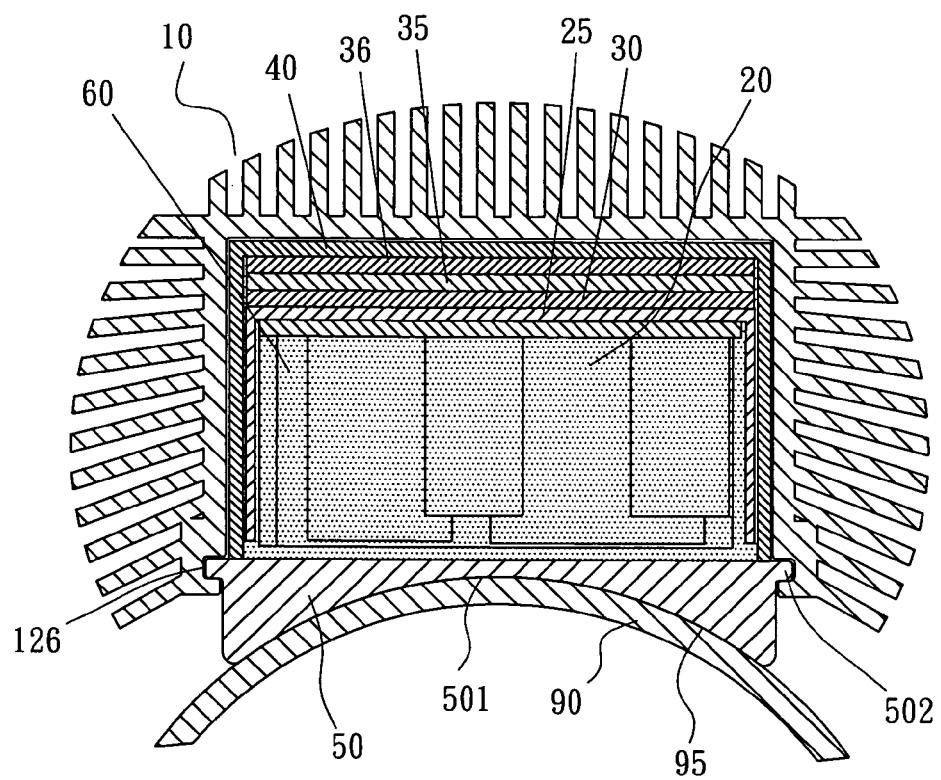
FIG. 3 is a cross-sectional view along the A-A line in FIG. 1.

As shown in FIG. 3, a heat-conducting material 60 is filled in the groove 12. The power supply 20, the PCB 30, the PCB 36, the insulating plate 35, the insulating container 40 and the heat-conducting material 60 stick together and become block-shaped. The heat-conducting material 60 contact and conduct heat on the groove 12 and an inner surface 52 of the bottom plate 50.

A connecting plate 61 is connected to a right open end of the groove 12 of the main heat-dissipating outer cover 10. A connecting hole 65 is disposed on the connecting plate 61 for connectors 301 and 361 of a PCB 30 and PCB 36 to pass through. The right open end is closed by the connecting plate 61 through a DC power output connector 301, an AC power input connector line 361, a nut 303 and a nut 363.

A right side plate 53 is extended from one side of the bottom plate 50, being extended to a right side of the main heat-dissipating outer cover 10, a line through hole 531, a fixing hole 532 and a fixing hole 533 being disposed thereon. A line through hole 541, a fixing hole 542 and a fixing hole 543 being disposed on a third water-resistant washer 54, the third water-resistant washer 54 sticking on the surface of the right side plate 53.

A side heat-dissipating outer cover 80 is wedged to the right side plate 53 of the bottom plate 50. A groove (not shown) is formed inside the side heat-dissipating outer cover 80. A left end of the side heat-dissipating outer cover 80 is connected to the right open end of the main heat-dissipating outer cover 10. The right end of the side heat-dissipating outer cover 80 is connected to a closing plate 85. The closing plate 85 has a connecting pin 851. The connecting pin 851 fixes the side heat-dissipating outer cover 80 to the right side plate 53 by a screw 852, so as to connect the main heat-dissipating outer cover 10 and the side heat-dissipating outer cover 80.

A slanted surface 57 is formed at a connecting area with the bottom plate 50. A fourth water-resistant washer 58 sticks on the slanted surface 57.

A heat-dissipating fin 81 and two connecting holes 82 are disposed on the side heat-dissipating outer cover 80.

A transverse groove 13 is disposed on a surface near the right open end of the main heat-dissipating outer cover 10, two ends of a connecting axis thereof are inserted movably into the two connecting holes 82 by a "⊓" shape fastener 17. The ends of the connecting axis rotate by taking the two connecting holes 82 as axial holes. The "⊓" shape fastener 17 hooks into the transverse groove 13 so as to locate the side heat-dissipating outer cover 80 onto the main heat-dissipating outer cover 10 quickly.

As shown in FIG. 3, a wedging groove 126 is disposed on the groove wall of the groove 12 of the main heat-dissipating outer cover 10. A raised track 502 is disposed on two sides of the bottom plate 50, and is wedged into the wedging groove 126.

Figure 4:
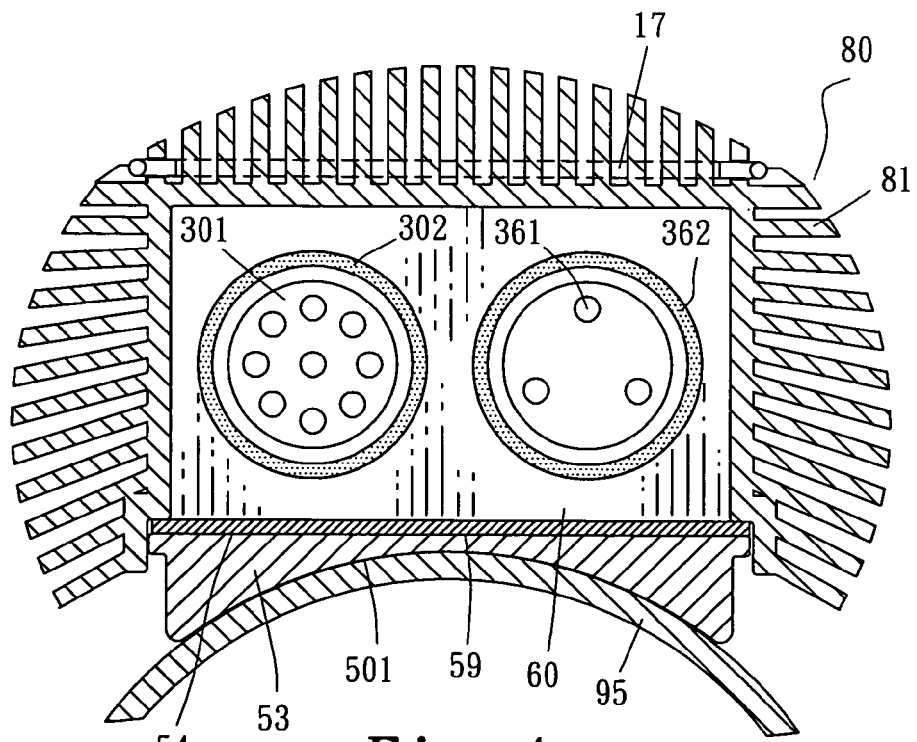
FIG. 4 is a cross-sectional view along the B-B line in FIG. 1.
Figure 5:
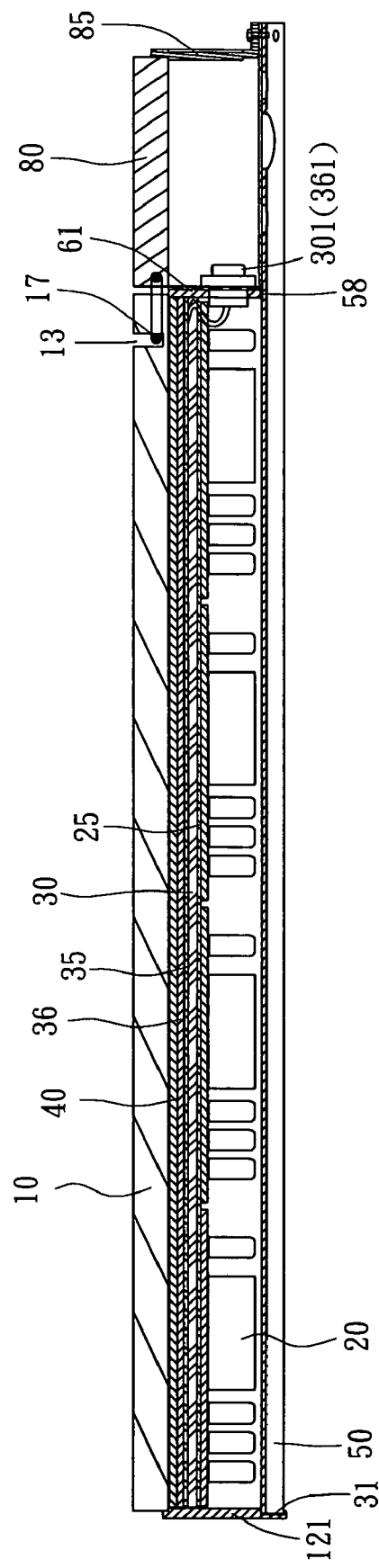
FIG. 5 is a transverse cross-sectional view according to one preferred embodiment of the present invention.
Figure 6:
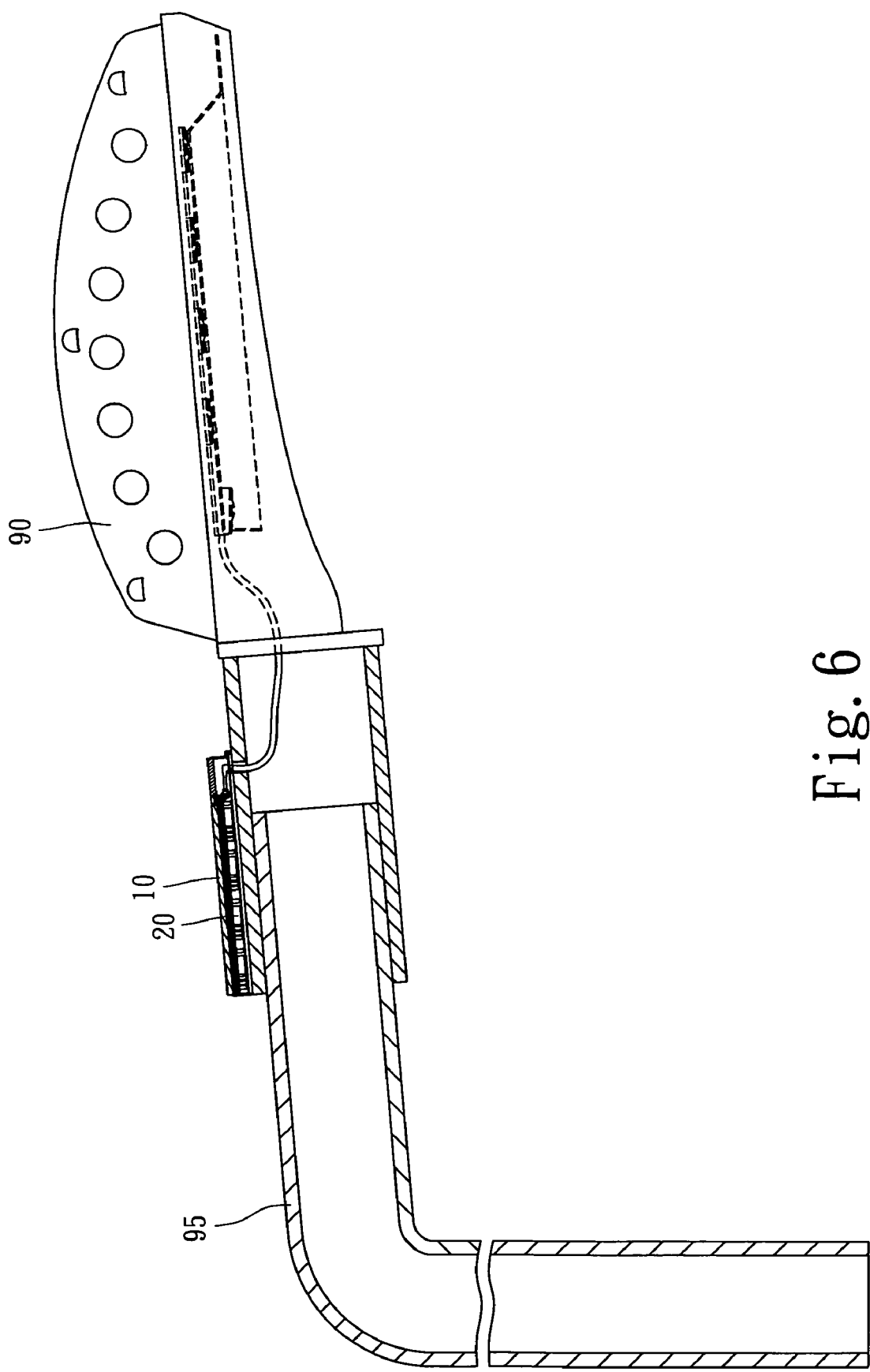
FIG. 6 is a cross-sectional schematic view showing one preferred embodiment of the present invention when disposed on a connector of a light base.

As shown in FIG. 4 to FIG. 6, a bottom surface of the bottom plate 50 is a curved surface or a flat surface 501 fixed on a LED light base of the LED light base 90 or a curved surface of the light pole 95, or a flat surface of a general LED device.

Figure 7:
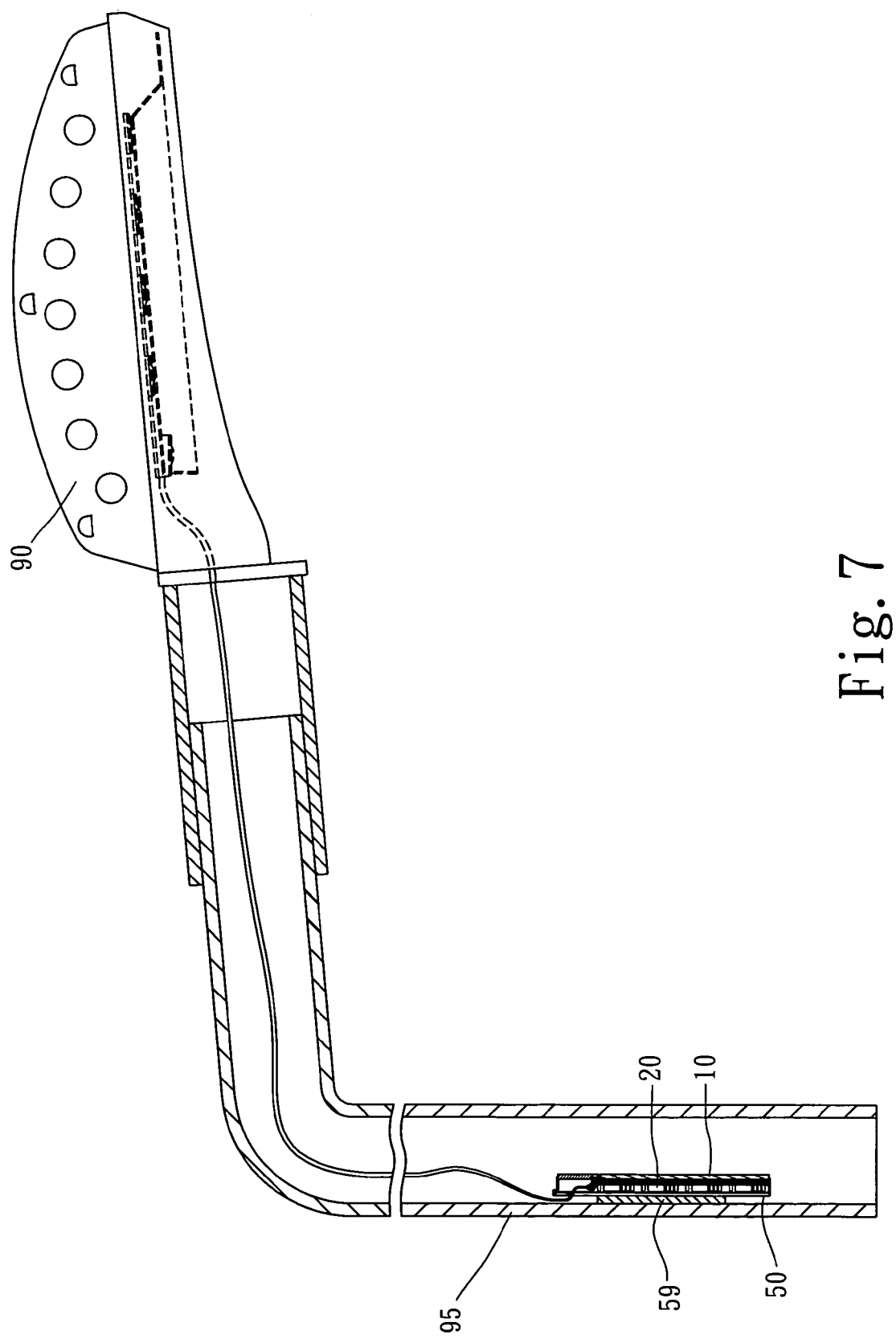
FIG. 7 is a cross-sectional schematic view showing one preferred embodiment of the present invention when disposed inside a light pole.

In an embodiment as shown in FIG. 7, a magnet plate 59 attaches on a bottom surface of the bottom plate 50. The magnet plate 59 works as an attaching component and attaches on an inner metal wall of the LED light pole 95.

The heat-conducting material 60 described above includes a heat-conducting glue, a heat-conducting grease, a packaging material and so on.

External components as the main heat-dissipating outer cover 10, the side heat-dissipating outer cover 80 and the bottom plate 50 can be treated with an anodizing process; Nickel plating or other special surface process to prevent oxidization.

In the embodiment as shown in FIG. 6 and FIG. 7, the LED street light is taken as an example, and other embodiments of the present invention are not limited to LED street lights but include general LED devices.

The present invention is characterized by the LED power supply being modularly designed by the main heat-dissipating outer cover 10, the PCB 30, the PCB 36 and the bottom plate 50 to conform to the number of the power supplies 20, as well as characterized by being water-resistant, dust-proof, highly acid or alkaline air-proof and direct heat-dissipating. In addition, the side heat-dissipating outer cover 80 has the functions of fast connection and viewing of the power input and output.

What is claimed:

1. A modular outdoor LED power supply comprising:
   a main heat-dissipating outer cover, the main heat-dissipating outer cover having a main groove inside and opening to the outside of the main heat-dissipating outer cover and having a plurality of main heat-dissipating fins on an outer surface of the main heat-dissipating outer cover;
   the main groove of the main heat-dissipating outer cover containing at least one power supplies, a plurality of PCBs, and an insulating plate;
   a heat-conducting material filling the main groove inside of the main heat-dissipating outer cover containing the at least one power supplies, the plurality of PCBs and the insulating plate;
   a bottom plate closing the opening to the outside of the main groove of the main heat-dissipating outer cover, the bottom plate providing a plurality of mounting spaces, each of the mounting spaces for mounting each of the at least one power supplies;
   an AC power input connector being connected to an end of a first PCB of the plurality of PCBs, the first PCB being electrically connected to the each of the at least one power supplies;
   a DC power output being connected to an end of a second PCB of the plurality of PCBs, the second PCB being electrically connected to the each of the at least one power supplies; and
   the insulating plate being disposed between the first PCB and the second PCB;
   wherein the modular outdoor LED power supply being modular according to a number of the each of the at least one power supplies required of the modular outdoor LED power supply, and the modular outdoor LED power supply is water-resistant, dust-proof, highly acid or alkaline air-proof, antirust and direct heat-dissipating.

2. The modular outdoor LED power supply as claimed in claim 1, further comprising a connecting plate connected to a right open end of the main groove of the main heat-dissipating outer cover and a side heat-dissipating outer cover capable of fast assembly to a right side of the main heat-dissipating outer cover.

3. The modular outdoor LED power supply as claimed in claim 1, wherein a right side plate is extended from a side of the bottom plate and extending to a right side of the main heat-dissipating outer cover, a first line through hole and a first fixing hole being disposed through the right side plate, a second line through hole and a second fixing hole being disposed through a water-resisting washer, the water-resistant washer sticking on a surface of the right side plate.

4. The modular outdoor LED power supply as claimed in claim 3, wherein a side heat-dissipating outer cover is wedged to the right side plate of the bottom plate, a side groove being provided inside and opening to the outside of the side heat-dissipating outer cover, a left end of the side heat-dissipating outer cover being connected to a right open end of the main heat-dissipating outer cover, a right end of the side heat-dissipating outer cover being connected to a closing plate, the closing plate having a connecting pin, the connecting pin fixing the side heat-dissipating outer cover to the right side plate by a screw so as to connect the main heat-dissipating outer cover and the side heat-dissipating outer cover.

5. The modular outdoor LED power supply as claimed in claim 4, wherein a side heat-dissipating fin and two connecting holes are disposed on the side heat-dissipating outer cover, a transverse groove being disposed on the outer surface near the right open end of the main heat-dissipating outer cover, two ends of a connecting axis of a "⊓" shape fastener being inserted movably into the two connecting holes, ends of the connecting axis rotating by taking the two connecting holes as axial holes, the "⊓" shape fastener hooking into the transverse groove so as to locate the side heat-dissipating outer cover onto the main heat-dissipating outer cover quickly.

6. The modular outdoor LED power supply as claimed in claim 3, wherein a slanted surface is formed at a connecting area between the right side plate and the bottom plate, and a water-resistant washer adhered on the slanted surface.

7. The modular outdoor LED power supply as claimed in claim 1, wherein a wedging groove is disposed on a groove wall of the main groove of the main heat-dissipating outer cover, and a raised track is disposed on two sides of the bottom plate and is wedged into the wedging groove, a bottom surface of the bottom plate being a curved surface for being fixed on a curved surface of a light pole of a LED light base, or a flat surface for being fixed on a flat surface of a general LED device.

8. The modular outdoor LED power supply as claimed in claim 1, wherein a magnet plate attaches on a bottom surface of the bottom plate, the magnet plate working as an attaching component and attaching on a inner metal wall of a LED light pole.

9. The modular outdoor LED power supply as claimed in claim 1, wherein the heat-conducting material includes at least one of a heat-conducting glue, a heat-conducting grease and a packaging material.

10. The modular outdoor LED power supply as, claimed in claim 1, wherein a connecting plate is connected to a right open end of the main groove of the main heat-dissipating outer cover, a connecting hole being disposed on the connecting plate for connectors of the plurality of PCBs to pass through, a water-resistant washer being added to the connecting plate to close a right side open end of the main heat-dissipating outer cover.

* * * * *